US010113231B2

(12) United States Patent
Dubois et al.

(10) Patent No.: US 10,113,231 B2
(45) Date of Patent: Oct. 30, 2018

(54) PROCESS KIT INCLUDING FLOW ISOLATOR RING

(71) Applicant: Applied Materials, Inc., Santa Clara, CA (US)

(72) Inventors: Dale R. Dubois, Los Gatos, CA (US); Kalyanjit Ghosh, San Jose, CA (US); Kien N. Chuc, Cupertino, CA (US); Mayur G. Kulkarni, Sunnyvale, CA (US); Sanjeev Baluja, Campbell, CA (US); Yanjie Wang, Santa Clara, CA (US); Sungjin Kim, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 81 days.

(21) Appl. No.: 15/138,209

(22) Filed: Apr. 25, 2016

(65) Prior Publication Data

US 2016/0312359 A1    Oct. 27, 2016

Related U.S. Application Data

(60) Provisional application No. 62/152,690, filed on Apr. 24, 2015.

(51) Int. Cl.
*H01L 21/67* (2006.01)
*H01J 37/32* (2006.01)
*C23C 16/44* (2006.01)

(52) U.S. Cl.
CPC .... *C23C 16/4401* (2013.01); *H01J 37/32477* (2013.01); *H01J 37/32623* (2013.01); *H01J 37/32651* (2013.01)

(58) Field of Classification Search
CPC ................................................. H01J 37/32651
See application file for complete search history.

(56) References Cited

U.S. PATENT DOCUMENTS 5,919,332 A * 7/1999 Koshiishi ............ C23C 16/5096
                                                    118/723 E
6,079,356 A * 6/2000 Umotoy ................ C23C 16/455
                                                    118/723 E (Continued)

FOREIGN PATENT DOCUMENTS

KR    20040085315 A    10/2004
KR    20130062955 A     6/2013

OTHER PUBLICATIONS

Written Opinion and International Search Report for PCT/US2016/023520 dated Jun. 24, 2016.

(Continued)

*Primary Examiner* — Gordon Baldwin
*Assistant Examiner* — Charlee J C Bennett
(74) *Attorney, Agent, or Firm* — Patterson + Sheridan LLP

(57) ABSTRACT

A process chamber is provided including a sidewall, a substrate support having an outer ledge, and a gas inlet beneath the substrate support. The process chamber further includes a first liner disposed around a bottom surface of the outer ledge of the substrate support. The first liner has an inner surface separated from the outer ledge of the substrate support by a first gap. The process chamber further includes a flow isolator ring having an inner bottom surface disposed on the outer ledge of the substrate support and an outer bottom surface extending outwardly relative to the inner bottom surface, the outer bottom surface overlying the first gap.

18 Claims, 5 Drawing Sheets

(56) References Cited

U.S. PATENT DOCUMENTS

| | | | |
|---|---|---|---|
| 6,884,297 B2 | 4/2005 | Park et al. | |
| 9,127,362 B2 | 9/2015 | Scheible et al. | |
| 9,953,843 B2* | 4/2018 | Shen | C23C 14/50 |
| 2001/0004478 A1 | 6/2001 | Zhao et al. | |
| 2001/0042514 A1* | 11/2001 | Mizuno | C23C 16/4412 |
| | | | 118/728 |
| 2003/0000647 A1* | 1/2003 | Yudovsky | C23C 16/4585 |
| | | | 156/345.51 |
| 2004/0187780 A1 | 9/2004 | Park et al. | |
| 2005/0150452 A1 | 7/2005 | Sen et al. | |
| 2007/0102286 A1 | 5/2007 | Scheible et al. | |
| 2007/0173059 A1 | 7/2007 | Young et al. | |
| 2007/0266945 A1* | 11/2007 | Shuto | C23C 16/4585 |
| | | | 118/723 E |
| 2008/0178801 A1* | 7/2008 | Pavloff | H01J 37/32477 |
| | | | 118/504 |
| 2010/0081284 A1* | 4/2010 | Balakrishna | C23C 16/45591 |
| | | | 438/710 |
| 2010/0173074 A1* | 7/2010 | Juarez | C23C 16/45523 |
| | | | 427/255.28 |
| 2012/0009765 A1* | 1/2012 | Olgado | C23C 16/45508 |
| | | | 438/478 |
| 2012/0205241 A1 | 8/2012 | Young et al. | |
| 2013/0206066 A1 | 8/2013 | Han et al. | |
| 2014/0262026 A1 | 9/2014 | Forster et al. | |
| 2014/0326276 A1* | 11/2014 | Wu | C23C 16/4405 |
| | | | 134/1.1 |
| 2015/0380223 A1 | 12/2015 | Scheible et al. | |
| 2016/0181088 A1 | 6/2016 | Ghosh et al. | |

OTHER PUBLICATIONS

Written Opinion and International Search Report for PCT/US2016/022620 dated Jun. 27, 2016.

* cited by examiner

PROCESS KIT INCLUDING FLOW ISOLATOR RING

CROSS-REFERENCE TO RELATED APPLICATIONS

This application claims priority to U.S. Provisional Patent Application Ser. No. 62/152,690, filed on Apr. 24, 2015, which herein is incorporated by reference.

BACKGROUND

Field of the Disclosure

Embodiments described herein generally relate to a process kit for a semiconductor process chamber, a semiconductor process chamber having a process kit, and a method for depositing a silicon based material therein.

Description of the Related Art

In the fabrication of integrated circuits, deposition processes such as chemical vapor deposition (CVD) or plasma enhanced CVD processes are used to deposit films of various materials upon semiconductor substrates. These depositions may take place in an enclosed process chamber. The process gases used in the depositions deposit films on the substrate, but may also deposit residue on the internal walls and other components of the process chamber. This residue builds up as more substrates are processed in the chamber and leads to generation of particles and other contaminants. These particles and contaminants can lead to the degradation of the deposited films on the substrates causing product quality issues. Process chambers must be periodically cleaned to remove the deposited residue on the chamber components.

A process kit may be disposed in the chamber to help define a processing region in a desired region within the chamber with respect to the substrate. The process kit typically includes one or more liners. The liners may be configured to assist in confining the plasma to the processing region and help prevent other components in the chamber from being contaminated with deposited materials, such as the residue mentioned above. The process gases may be supplied above a substrate support. A purge gas may be provided from below the substrate support to prevent process gases from reaching areas at the bottom of the chamber and causing deposit of residue in the areas below the substrate support. The process gas and the purge gas may be removed from the process chamber using a common exhaust disposed away from the process area, such as around an outer perimeter of the process chamber, to prevent mixing of the purge gas with the process gas in the process area. Using the arrangement described above, unexplained arcing and particle formation can occur in the process area above the substrate causing defects in the products made in the process chamber. Thus, there is a need for an improved process chamber or improved processing component in the process chamber to prevent this unexplained arcing and particle formation.

SUMMARY

Embodiments disclosed herein generally relate to process kits used to protect different parts of process chambers, such as plasma process chambers. In one embodiment, a process chamber is provided including a sidewall, a substrate support having an outer ledge, and a gas inlet beneath the substrate support. The process chamber further includes a first liner disposed around a bottom surface of the outer ledge of the substrate support. The first liner has an inner surface separated from the outer ledge of the substrate support by a first gap. The process chamber further includes a flow isolator ring having an inner bottom surface disposed on the outer ledge of the substrate support and an outer bottom surface extending outwardly relative to the inner bottom surface, the outer bottom surface overlying the first gap.

In another embodiment, a method of processing a substrate in a process chamber including a substrate support, a first liner, and a flow isolator ring is provided. The method includes placing an outer bottom surface of the flow isolator ring on a top surface of the first liner, wherein the first liner is disposed outwardly relative to the substrate support and the flow isolator ring includes an inner bottom surface extending inwardly relative to the outer bottom surface. The method further includes raising the substrate support from a lowered position to a raised position to lift the flow isolator ring by the inner bottom surface from the first liner using an outer ledge of the substrate support, wherein the first liner is disposed around a bottom surface of the outer ledge of the substrate support. The first liner has an inner surface separated from the outer ledge of the substrate support by a first gap. The outer bottom surface of the flow isolator ring overlies the first gap. The method further includes supplying a process gas from above the substrate support and a purge gas from below the substrate support.

In another embodiment, a process kit for processing a substrate is provided. The process kit includes a first liner having an annular body, a top surface, and an outer angled surface. The process kit further includes a flow isolator ring including an outer bottom surface, an inner bottom surface, and an outer angled surface. The outer bottom surface is disposed on the top surface of the first liner. The inner bottom surface extends inwardly relative to the first liner. The outer angled surface of the flow isolator ring is oriented at angle between 40 and 50 degrees relative to a horizontal plane, wherein the outer angled surface of the flow isolator ring is substantially parallel to the outer angled surface of the first liner. The process kit further includes a second liner surrounding at least the top surface of the first liner, the second liner has an inner angled surface disposed above the flow isolator ring, wherein the inner angled surface of the second liner and the outer angled surface of the flow isolator ring are substantially parallel to each other.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to process kits used to protect different parts of process chambers, such as plasma process chambers. Specifically, the process kits described below include a flow isolator ring as an additional feature in preventing purge gas from entering a process area above the substrate. Without being bound by any particular theory, it is thought that the unexplained arcing and particle formation discussed above may be caused by purge gas reaching the process area. The flow isolator rings discussed below can be disposed above a gap between the substrate support and a liner surrounding the substrate support.

Figure 1A:
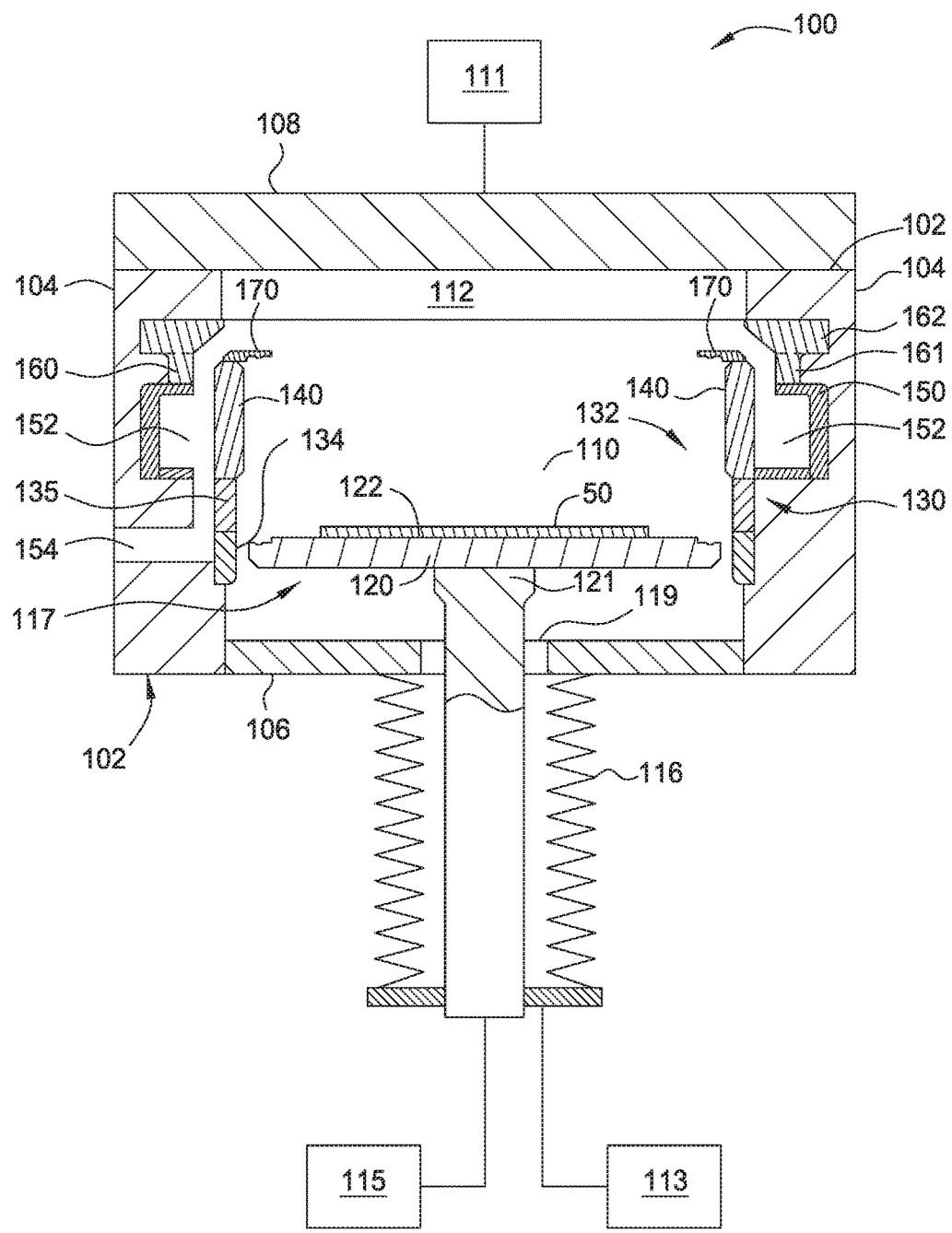
FIG. 1A is a side sectional view of a process chamber including a process kit disposed around a substrate support in a lowered position, according to one embodiment of the disclosure.
Figure 1B:
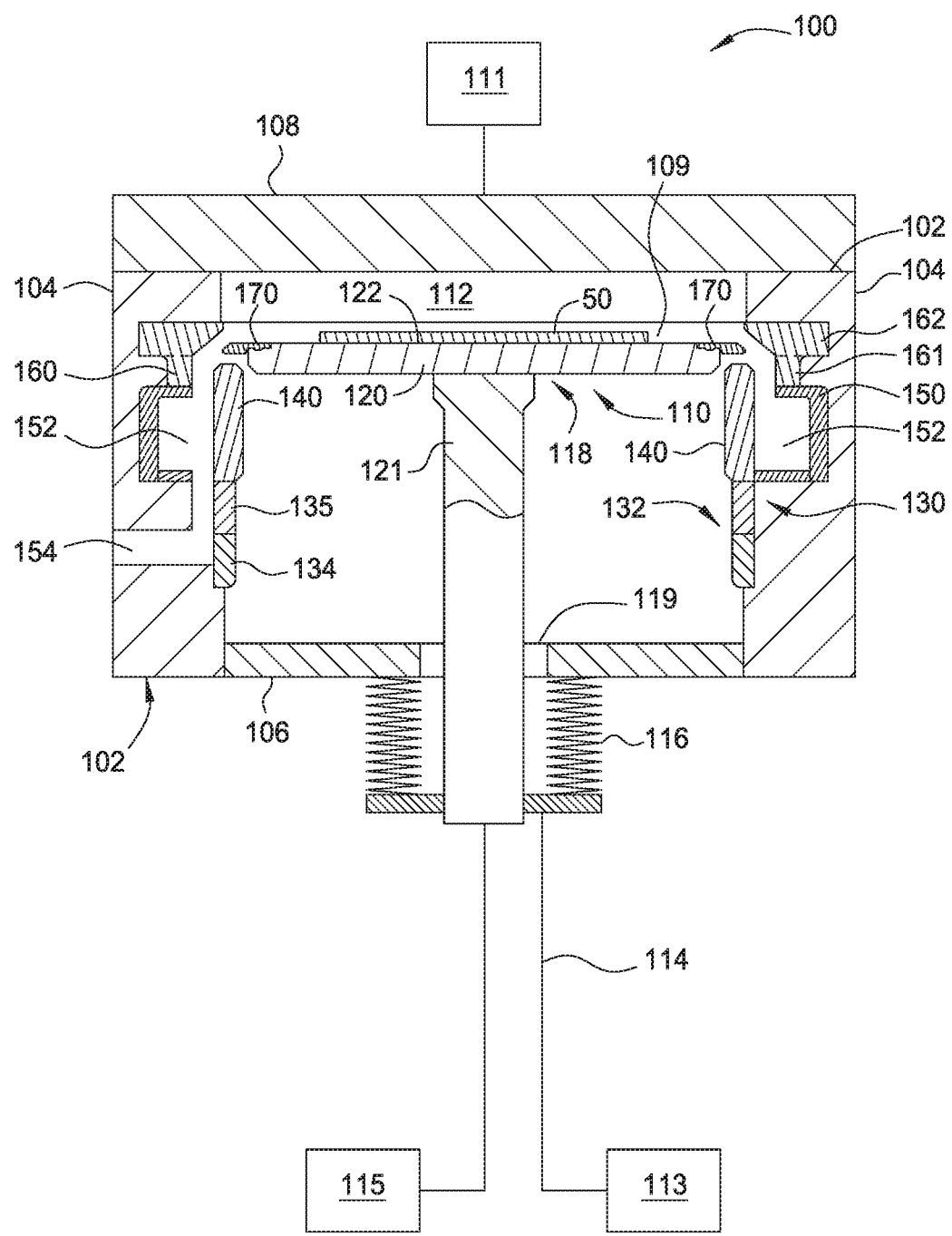
FIG. 1B is a side sectional view of the process chamber including the process kit disposed around the substrate support in a raised position, according to one embodiment of the disclosure.
Figure 2:
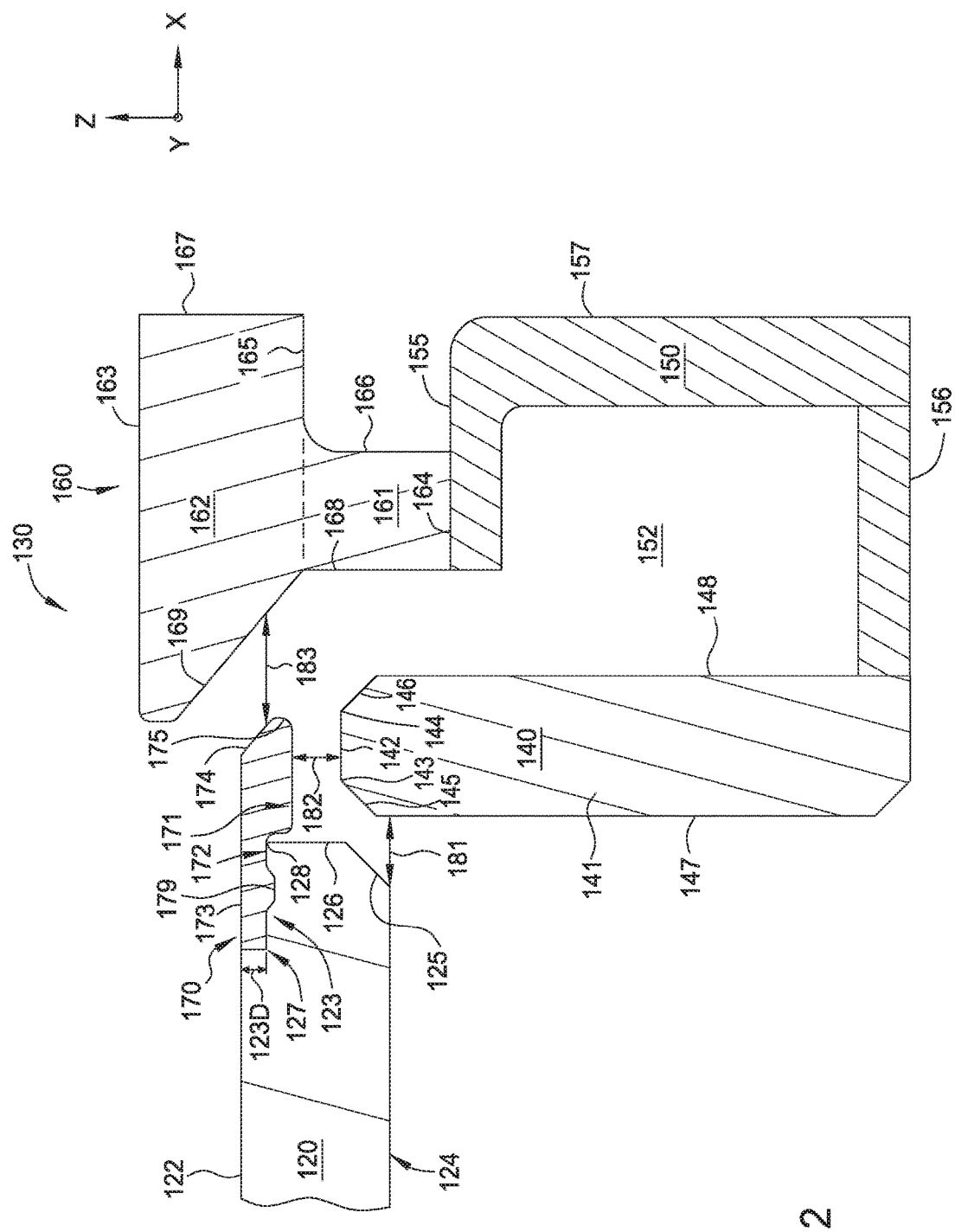
FIG. 2 is a partial side sectional view of a process kit when the substrate support is in the raised position, according to one embodiment of the disclosure.
Figure 3:
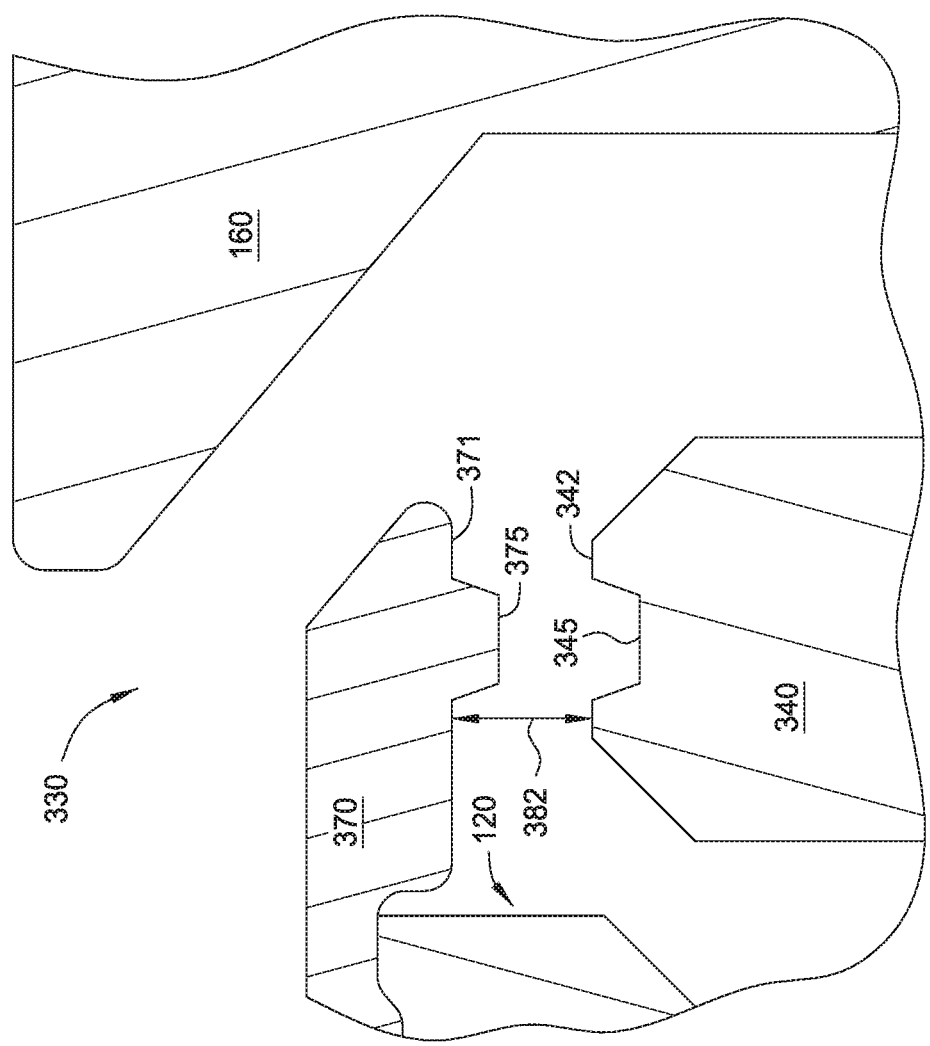
FIG. 3 is a partial side sectional view of a process kit when the substrate support is in the raised position, according to another embodiment of the disclosure.

FIG. 1A is a side sectional view of a process chamber 100 including a process kit 130 disposed around a substrate support 120 in a lowered position 117 according to one embodiment of the disclosure. FIG. 1B is a side sectional view of the process chamber 100 including the process kit 130 disposed around the substrate support 120 in a raised position 118 (the processing position) according to one embodiment of the disclosure. The sectional views of FIGS. 1A and 1B as well as FIGS. 2 and 3 shown below are cross-sectional views, so that parts behind or at other depths through the plane of the Figure are not shown in the drawings for clarity. For example, FIG. 1A includes a top liner 140 having a ring shape, but the connecting part of the ring shape is not visible in the thin cross-sectional view of FIG. 1A. These parts were omitted in order to not clutter the drawing and to make the gas flow of the process gas and purge gas discussed below easier to understand.

The process kit 130 is configured to reduce particle deposition on the chamber components and prevent purge gas from entering a process volume 109 above the substrate support 120, which advantageously reduces defects and increases the service interval.

The process chamber 100 includes a chamber body 102 having one or more side walls 104, a bottom 106, and a lid 108 disposed on the side walls 104. The side walls 104, bottom 106, and lid 108 define an interior volume 110 of the process chamber 100. The process chamber 100 includes a gas distribution plate 112 and the substrate support 120. The region between the substrate support 120 in the raised position 118 (FIG. 1B) and the gas distribution plate 112 is defined by the process volume 109. The gas distribution plate 112 supplies process gases from a process gas source 111 to the process volume 109. The process chamber 100 may be a plasma chamber, such as a chamber including a plasma source (e.g., a capacitively coupled plasma chamber with a RF-hot gas distribution plate) or a chamber connected to a remote plasma source (RPS).

The substrate support 120 is disposed in the interior volume 110. The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a substrate supporting surface 122 that receives and supports a substrate 50 during processing. The substrate support 120 is coupled to a supporting shaft 121 that is coupled to a lift mechanism 115 below the bottom 106 of the process chamber 100. A bellows 116 may disposed around the portion of the supporting shaft 121 that is below the bottom 106 of the process chamber to isolate the supporting shaft 121 from the external environment. The lift mechanism 115 is configured to move the substrate support 120 between the lowered position 117 (see FIG. 1A) and the raised position 118 (see FIG. 1B). The substrate support 120 is placed in the raised position 118 for processing of the substrate 50. In the lowered position 117, a robot or other transfer mechanism may be used to place the substrate 50 in the process chamber 100, such as placing the substrate 50 on lift pins (not shown) extending above the substrate support 120.

A purge gas may be supplied to the process chamber 100 during processing or cleaning of the process chamber 100. The purge gas may be supplied from a purge gas source 113 through a purge gas line 114. In some embodiments, the purge gas line 114 may be coupled to the process chamber 100 through the bellows 116 in order to maintain a positive pressure in the bellows during movement of the substrate support 120 by the lift mechanism 115. The purge gas may be oxygen, or an inert gas, such as nitrogen or argon. The purge gas helps to prevent process gases from the gas distribution plate 112 from entering portions of the interior volume 110 below the substrate support 120 and depositing on any of the components below the substrate support 120. Prevention of process gases below the substrate support 120 avoids unnecessary cleaning of the components below the substrate support 120. Thus, using the purge gas reduces overall clean time and increases throughput of the process chamber 100.

The process kit 130 can surround the substrate support 120 and the supporting shaft 121. The process kit 130 includes a liner assembly 132. The liner assembly 132 includes one or more liners that are disposed between the substrate support 120 and the side walls 104. The one or more liners protect the side walls 104 of the process chamber 100 from energized gases during processing and cleaning of the process chamber 100. The liner assembly 132 includes a bottom liner 134, a middle liner 135, and a top liner 140 (a first liner). The bottom liner 134, the middle liner 135, and the top liner 140 may be formed of a ceramic material, such as aluminum oxide. The bottom liner 134 is disposed above the top of the bottom 106 of the chamber body 102. The middle liner 135 is disposed on top of the bottom liner 134. The middle liner 135 includes a slot (not shown) to allow transfer of the substrate 50 into and out of the process chamber 100. The top liner 140 is disposed on top of the middle liner 135. In some embodiments, the bottom liner 134, the middle liner 135 and the top liner 140 form a continuous surface surrounding (i.e., 360 degrees) the substrate support 120 and the supporting shaft 121. In other embodiments, there may be one or more gaps between portions of the liners 134, 135, 140 to accommodate other components, but the liners 134, 135, 140 still substantially surround (i.e., at least 85%) the substrate support 120 and the supporting shaft 121.

The process kit 130 further includes additional liners to aid in removal gases, such as process gases and purge gases, from the interior volume 110 of the process chamber 100. These additional liners may include a T-liner 160 (a second liner) and a C-liner 150 (a third liner). Although a cross-section of the C-liner 150 and the T-liner 160 roughly take the shape of a "C" and a "T" respectively, these liners may take other shapes that enable removal of gases from the process chamber 100. In some embodiments, the C-liner 150 and the T-liner 160 surround (i.e., 360 degrees) the substrate support. In other embodiments, there may be one or more gaps between portions of the C-liner 150 and/or the T-liner 160 to accommodate other components, but the C-liner 150 and the T-liner 160 still substantially surround (i.e., at least 85%) the substrate support 120.

The C-liner 150 can surround the substrate support 120 and one or more of the bottom liner 134, the middle liner 135, and the top liner 140. The C-liner 150 may be formed of a ceramic material, such as aluminum oxide. The C-liner 150 may be disposed in a recess 105 in the side walls 104. The recess 105 may also be C-shaped. The C-liner includes a pumping channel 152 that is at least partially defined by a surface of the C-liner 150. The pumping channel 152 connects to a pumping port 154 used to exhaust gases from the process chamber 100 by use of, for example a vacuum pump (not shown) that is positioned outside of the process chamber.

The T-liner 160 can surround the substrate support 120 and one or more of the bottom liner 134, the middle liner 135, and the top liner 140. The T-liner 160 may be formed of a ceramic material, such as aluminum oxide. The T-liner may generally include a base portion 161 and a top portion 162. The base portion 161 of the T-liner 160 may be disposed on top of the C-liner 150. The top portion 162 may contact the side walls 104. In some embodiments, the top portion 162 may contact the gas distribution plate 112.

The process kit 130 further includes a flow isolator ring 170. The flow isolator ring 170 may be formed of a ceramic material, such as aluminum nitride. The flow isolator ring is disposed on the top liner 140 when the substrate support 120 is in the lowered position 117 (see FIG. 1A). The flow isolator ring 170 is lifted from the top liner 140 by the substrate support 120 when the substrate support 120 is moved to the raised position 118 (see FIG. 1B). The flow isolator ring 170 can be used to prevent purge gas from entering the process volume 109 between the substrate support 120 and the gas distribution plate 112. Specifically, the flow isolator ring 170 overlies a first gap 181 (see FIG. 2) between the top liner 140 and the substrate support 120. Further details of the flow isolator ring and the flow of the purge gas and the process gas are discussed with reference to FIG. 2 below.

FIG. 2 is a partial side sectional view of the process kit 130 and the substrate support 120 when the substrate support 120 is in the raised position 118 according to one embodiment of the disclosure. FIG. 2 allows further details of the substrate support 120, the flow isolator ring 170, the top liner 140, the C-liner 150, flow isolator ring 170, and the T-liner 160 to be shown.

The substrate support 120 further includes a bottom surface 124, an outer angled surface 125, and an outer surface 126. The outer angled surface 125 can extend outwardly from the bottom surface 124 to the outer surface 126. The outer angled surface 125 is oriented at an angle from about 20 degrees to about 70 degrees from a horizontal plane (e.g., the X-Y plane), such as from about 40 degrees to about 50 degrees from the X-Y plane. The substrate support 120 further includes an outer ledge 123 for supporting the flow isolator ring 170. The outer ledge 123 extends from an inner edge 127 to an outer edge 128. The outer edge 128 can connect to the outer surface 126. The outer ledge 123 can be disposed below the substrate supporting surface 122. In some embodiments, a depth 123D of the outer ledge 123 from the substrate supporting surface 122 is sized, so that a top surface 173 of the flow isolator ring 170 does not extend past the substrate supporting surface 122 when disposed on the outer ledge 123, which can prevent the flow isolator ring 170 from reducing the process volume 109. For example, FIG. 2 shows that the top surface 173 of the flow isolator ring 170 is substantially flush with the substrate supporting surface 122. Furthermore, in some embodiments the substrate support 120 may include one or more alignment recesses 129 that may be used to ensure the flow isolator ring 170 is correctly positioned on the substrate support 120. The flow isolator ring can include a corresponding one or more alignment protrusions 179 to fit in the one or more alignment recesses 129. The bottom surface 124 may form the bottom surface of the outer ledge 123 and/or the bottom surface of the remainder of the substrate support 120.

The flow isolator ring 170 further includes an outer bottom surface 171 and an inner bottom surface 172. The outer bottom surface 171 is disposed on a top surface 142 of the top liner 140 when the substrate support 120 is in the lowered position 117 (see FIG. 1A). The outer bottom surface 171 includes an outer edge 175. The top surface 173 is located inwardly relative to the outer edge 175 of the outer bottom surface 171. Used herein "inwardly" refers to a direction towards a center of the process chamber 100, such as a center of the substrate support 120. Conversely, used herein "outwardly" refers to a direction from an interior position in the process chamber 100 towards one of the sidewalls 104. The inner bottom surface 172 is disposed on the outer ledge 123 of the substrate support 120 when the substrate support 120 is in the raised position 118 (see FIG. 1B and FIG. 2). The flow isolator ring 170 further includes an outer angled surface 174 extending inwardly from the outer bottom surface 171 to the top surface 173. The outer angled surface 174 is oriented inwardly towards the top surface 173 from the outer bottom surface 171. The outer angled surface 174 is oriented at an angle from about 20 degrees to about 70 degrees from a horizontal plane (e.g., the X-Y plane), such as from about 40 degrees to about 50 degrees from the X-Y plane.

The top liner 140 further includes an annular body 141, an inner angled surface 145, an outer angled surface 146, an inner surface 147, and an outer surface 148. The top surface 142 of the top liner 140 includes an inner edge 143 and an outer edge 144. The inner angled surface 145 extends outwardly from the inner surface 147 to the inner edge 143 of the top surface 142. The inner angled surface 145 is oriented at an angle from about 20 degrees to about 70 degrees from a horizontal plane (e.g., the X-Y plane), such as from about 40 degrees to about 50 degrees from the X-Y plane. The outer angled surface 146 extends inwardly from the outer surface 148 to the outer edge 144 of the top surface 142. In some embodiments, the inner angled surface 145 is substantially parallel to the outer angled surface 125 of the substrate support 120. The outer angled surface 146 is oriented at an angle from about 20 degrees to about 70 degrees from a horizontal plane (e.g., the X-Y plane), such as from about 40 degrees to about 50 degrees from the a horizontal plane (e.g., the X-Y plane). In some embodiments, the outer angled surface 146 is substantially parallel to the outer angled surface 174 of the flow isolator ring 170.

The top liner 140 is separated from the outer ledge 123 of the substrate support 120 by the first gap 181. The first gap 181 can represent a closest distance between the top liner 140 and the substrate support 120 when the substrate support is in the raised position 118. For example, the first gap 181 can be a distance from the inner surface 147 of the top liner 140 to the outer ledge 123 of the substrate support 120, such as to the outer angled surface 125 of the outer ledge 123. In some embodiments, the first gap 181 can be uniformly spaced between an annularly shaped inner surface 147 and the circular shaped outer ledge 123. In some embodiments, the first gap 181 can be a distance from the inner angled surface 145 of the top liner 140 to the outer ledge 123 of the substrate support 120. The first gap 181 can be from about 25 mils to about 200 mils, such as from about 50 mils to about 100 mils, for example about 75 mils. During operation, the purge gas from the purge gas inlet 119 (see FIG. 1A) can flow up through the first gap 181. The flow isolator ring 170 overlies the first gap 181 and prevents the purge gas from flowing straight up the first gap 181 to above the substrate support 120, where the purge gas can cause problems, such as arcing or particle formation above the substrate 50. To reach an area above the substrate support 120, the purge gas would have to reverse directions in the X-Y plane to flow around flow isolator ring 170 and flow through the downward pressure of the process gas, which is flowing down between the flow isolator ring 170 and the second liner 160.

The flow isolator ring 170 is separated from the top surface 142 of the top liner 140 by a second gap 182. The second gap 182 can represent a closest distance between the flow isolator ring 170 and the top liner 140 when the substrate support is in the raised position 118. For example, the second gap 182 can be a distance from the outer bottom surface 171 of the flow isolator ring 170 to the top surface 142 of the top liner 140. In some embodiments, the outer bottom surface 171 overlies at least half of the top surface 142 of the top liner 140. In other embodiments, the outer bottom surface 171 overlies all of the top surface 142 of the top liner 140. In still other embodiments, the outer bottom surface extends outwardly past the top surface 142 of the top liner 140 to provide a further obstruction for the purge gas to reach the process volume 109 above the substrate 50. The second gap 182 can be from about 100 mils to about 600 mils, such as from about 200 mils to about 400 mils, for example about 300 mils. During operation, the purge gas after flowing through the first gap 181 flows through the second gap 182. The purge gas then mixes with the process and flows down between the top liner 140 and the T-liner 160 before being pumped out of the process chamber 100 though the pumping channel 152 and the pumping port 154.

The C-liner 150 further includes a top 155, a bottom 156, and a side 157 connecting the bottom 156 and the top 155. As mentioned above, the T-liner 160 includes a base portion 161 and a top portion 162. The base portion 161 includes a first bottom surface 164, a first outer surface 166, and an inner surface 168. The top portion 162 includes a top surface 163, a second bottom surface 165, a second outer surface 167, and an inner angled surface 169. The inner surface 168 extends from the first bottom surface 164 to the inner angled surface 169. The inner angled surface 169 extends inwardly from the inner surface 168 to the top surface 163. The inner angled surface 169 is oriented at an angle from about 20 degrees to about 70 degrees from a horizontal plane (e.g., the X-Y plane), such as from about 40 degrees to about 50 degrees from the X-Y plane. In some embodiments, the outer angled surface 146 is substantially parallel to the outer angled surface 174 of the flow isolator ring 170. The first outer surface 166 extends from the first bottom surface 164 to the second bottom surface 165. The second bottom surface 165 extends outwardly from the first outer surface 166 to the second outer surface 167. The second outer surface 167 extends from the second bottom surface 165 to the top surface 163.

The T-liner 160 is separated from the top surface 142 of the top liner 140 by a third gap 183. The third gap 183 can represent a closest distance between the T-liner 160 and flow isolator ring 170 when the substrate support is in the raised position 118. For example, the third gap 183 can be a distance from the inner angled surface 169 of the T-liner 160 to the outer angled surface 174 of the flow isolator ring 170. The third gap 183 can be from about 20 mils to about 200 mils, such as from about 40 mils to about 120 mils, for example about 80 mils. During operation, the process gas from the gas distribution plate 112 (see FIG. 1A) can flow down through the third gap 183. Then the process gas is mixed with the purge gas and both gases are exhausted down through the pumping channel 152 and out the pumping port 154 (see FIG. 1A).

FIG. 3 is a partial side sectional view of a process kit 330 when the substrate support 120 is in the raised position 118, according to another embodiment of the disclosure. The process kit 330 is similar to the process kit 130 except that the process kit 330 includes a flow isolator ring 370 and a top liner 340 that are different from the flow isolator ring 170 and the top liner 140 of the process kit 130. The top liner 340 includes a recess 345 in a top surface 342 of the top liner 340. The recess 345 may extend around all of the top liner 340 (i.e., 360 degrees). The flow isolator ring 370 includes a protrusion 375 extending down from the outer bottom surface 371. The protrusion 375 can extend around all of the flow isolator ring 370. The protrusion 375 can be designed to fit in the recess 345, so that the outer bottom surface 371 is flush with the top surface 342 of the top liner 340 when the substrate support 120 is in the lowered position 117 (e.g., FIG. 1A). In some embodiments, the top liner includes one or more recesses 345 that only extends partially around the top liner 340, such as a few degrees around the top liner 340. In such embodiments, the flow isolator may include one or more protrusions 375 that extend a similar amount around (e.g., a few degrees) the flow isolator ring 370, so that the one or more protrusion 375 can fit in the respective one or more recesses 345. The one or more recesses 345 and the one or more protrusions 375 can be used to ensure the flow isolator ring 370 is correctly positioned on the top liner 340 when the substrate support 120 is in the lowered position 117 (see FIG. 1A).

In embodiments, in which the protrusion 375 extends all the way around the flow isolator ring (i.e., 360 degrees), the protrusion 375 can also create some downward motion for the flow of the purge gas as the purge gas flows through the gap 382 between the flow isolator ring 370 and the top liner 340 further reducing the likelihood of purge gas reaching areas above the substrate support 120. In other embodiments, the flow isolator ring may include a downward extending feature to further encourage downward flow of the purge gas. For example, referring to FIG. 2, a flow isolator ring may include a downward extending feature overlying the outer angled surface 146 of the top liner. This downward extending feature could be flush with the outer angled surface 146 when the substrate support 120 is in the lowered position 117 (see FIG. 1A) or the downward extending feature could fit into a recess in the outer angled surface 146 when the substrate support 120 is in the lowered position 117.

Figure 4:
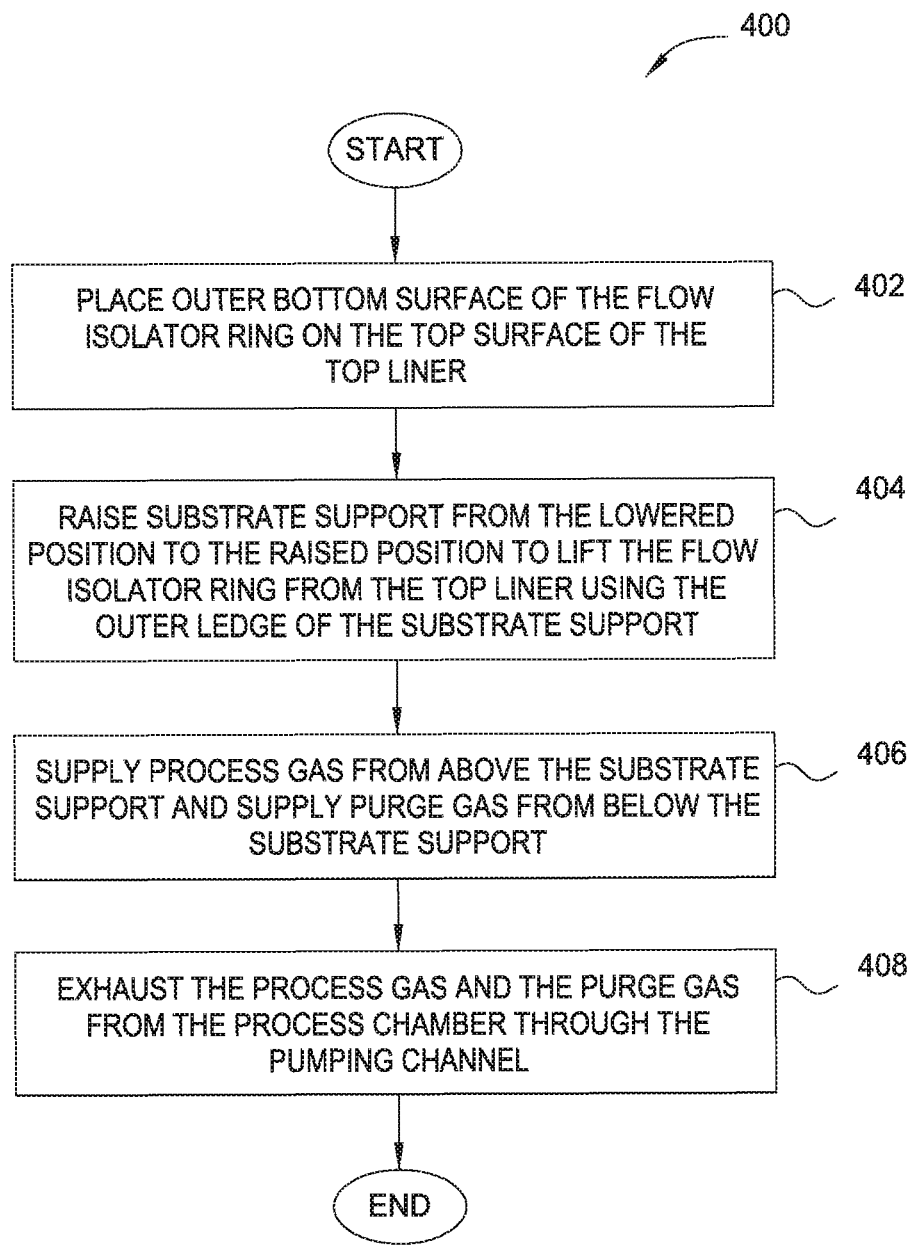
FIG. 4 is a process flow diagram of a method of processing a substrate in a process chamber, according to one embodiment.

Referring to FIGS. 1A, 1B, and 4 is a process flow diagram of a method 400 for processing a substrate in the process chamber 100 including the process kit 130, according to one embodiment. At block 402, the outer bottom surface 171 of the flow isolator ring 170 is placed on the top surface 142 of the top liner 140. The top liner 140 is disposed outwardly relative to the substrate support 120. The flow isolator ring 170 includes the inner bottom surface 172 extending inwardly relative to the outer bottom surface 171. Block 402 may be executed on initial placement of the flow isolator ring 170 in the process chamber 100 or when the substrate support 120 lowers from the raised position 118 to the lowered position 117, which places the flow isolator ring 170 on the top liner 140.

At block 404, the substrate support 120 is raised from the lowered position 117 to the raised position 118 to lift the flow isolator ring 170 by the inner bottom surface 172 from the top liner 140 using the outer ledge 123 of the substrate support 120. The top liner 140 is disposed around the bottom surface 124 of the outer ledge 123 of the substrate support 120. The inner surface 147 of the top liner 140 is separated from the outer ledge 123 of the substrate support 120 by the first gap 181. The outer bottom surface 171 of the flow isolator ring 170 overlies the first gap 181.

At block 406, a process gas is supplied from above the substrate support 120 and a purge gas is supplied from below the substrate support 120.

At block 408, the process gas and the purge gas are exhausted from the process chamber 100 through the pumping channel 152 disposed outwardly relative to the top liner 140 and below the top surface 142 of the top liner 140. In some embodiments, a vacuum pump (not shown) can be used to exhaust the process gas and the purge gas through the pumping channel 152 and out the pumping port 154. The flow isolator ring 170 and arrangement of the other liners of the process kit 130 in combination with the low pressure or vacuum pressure supplied from the pumping port prevent the purge gas from rising above the substrate support. Preventing the purge gas from reaching areas above the substrate support 120 avoids problems, such as arcing or particle formation caused by the purge gas. Because arcing and particle formation from purge gas can cause defects on the substrate being processed, product quality and uniformity can be improved by using the substrate support 120 and the process kit 130 that includes the flow isolator ring 170 and other liners discussed above. After processing of the substrate 50, the method 400 may be repeated to complete additional processes on the same or different substrates.

While the foregoing is directed to embodiments of the present disclosure, other and further embodiments of the disclosure may be devised without departing from the basic scope thereof, and the scope thereof is determined by the claims that follow.

What is claimed is:

1. A process chamber comprising:
    a sidewall;
    a substrate support having an outer ledge;
    a gas inlet beneath the substrate support;
    a first liner having an annular inner surface separated from the outer ledge of the substrate support by a first gap, the first liner further having an outer angled surface; and
    a flow isolator ring having an inner bottom surface configured to be disposed on the outer ledge of the substrate support when the substrate support is in a raised position and an outer bottom surface extending outwardly relative to the inner bottom surface, the outer bottom surface overlying the first gap, wherein the flow isolator ring further comprises:
        a top surface located inwardly relative to an outer edge of the outer bottom surface; and
        an outer angled surface between the top surface and the outer bottom surface, the outer angled surface oriented inwardly towards the top surface, wherein
            the outer bottom surface of the flow isolator ring is configured to be disposed on the first liner when the substrate support is in a lowered position, and
            the outer angled surface of the flow isolator ring and the outer angled surface of the first liner are configured to be collinear when the substrate support is in the lowered position.

2. The process chamber of claim 1, wherein a top surface of the first liner is above a bottom surface of the outer ledge.

3. The process chamber of claim 2, wherein the outer bottom surface of the flow isolator ring overlies at least half of the top surface of the first liner.

4. The process chamber of claim 2, wherein the outer bottom surface of the flow isolator ring overlies all of the top surface of the first liner.

5. The process chamber of claim 1, wherein the outer angled surface of the flow isolator ring is oriented at an angle from about 40 degrees to about 50 degrees relative to a horizontal plane.

6. The process chamber of claim 1, further comprising a second liner disposed outwardly relative to the flow isolator ring, the second liner having an inner angled surface spaced apart from the outer angled surface of the flow isolator ring, wherein the inner angled surface of the second liner and the outer angled surface of the flow isolator ring are substantially parallel to each other.

7. The process chamber of claim 1, wherein the outer bottom surface of the flow isolator ring is spaced apart from the top surface of the first liner by a distance from about 200 mils to about 400 mils.

8. The process chamber of claim 7, wherein the flow isolator ring includes a protrusion extending down from the outer bottom surface.

9. The process chamber of claim 1, wherein the first gap is from about 50 mils to about 100 mils.

10. The process chamber of claim 1, wherein the outer ledge of the substrate support is lower than a substrate supporting surface of the substrate support.

11. The process chamber of claim 10, wherein a top surface of the flow isolator ring is substantially flush with the substrate supporting surface.

12. The process chamber of claim 1, further comprising a gas distribution plate disposed above the substrate support.

13. A process kit for processing a substrate comprising:
    a first liner having an annular body, a top surface, and an outer angled surface;
    a flow isolator ring comprising:
        an outer bottom surface disposed on the top surface of the first liner;
        an inner bottom surface extending inwardly relative to the first liner; and
        an outer angled surface oriented at angle between 40 and 50 degrees relative to a horizontal plane; and a second liner surrounding at least the top surface of the first liner, the second liner having an inner angled surface disposed above the flow isolator ring, wherein the inner angled surface of the second liner and the outer angled surface of the flow isolator ring are substantially parallel to each other, and the outer angled surface of the flow isolator ring and the outer angled surface of the first liner are collinear.

14. The process kit of claim 13, further comprising a third liner surrounding the first liner, wherein the second liner is disposed on a top of the third liner.

15. The process kit of claim 13, wherein the flow isolator ring includes a protrusion extending down from the outer bottom surface.

16. The process chamber of claim 8, wherein the substrate support includes a recess, and the protrusion extending down from the outer bottom surface of the flow isolator ring is configured to fit into the recess.

17. The process chamber of claim 16, wherein the first liner further includes an inner angled surface, the substrate support further includes an outer angled surface, the inner angled surface of the first liner is substantially parallel to the outer angled surface of the substrate support, and the inner angled surface of the first liner and the outer angled surface of the substrate support are configured to be disposed at same vertical location when the substrate support is in the raised position.

18. The process chamber of claim 17, further comprising a second liner disposed outwardly relative to the flow isolator ring, the second liner having an inner angled surface spaced apart from the outer angled surface of the flow isolator ring, wherein the inner angled surface of the second liner and the outer angled surface of the flow isolator ring are substantially parallel to each other.

* * * * *